United States Patent
Lee et al.

(10) Patent No.: US 7,378,309 B2
(45) Date of Patent: May 27, 2008

(54) METHOD OF FABRICATING LOCAL INTERCONNECTS ON A SILICON-GERMANIUM 3D CMOS

(75) Inventors: Jong-Jan Lee, Camas, WA (US); Paul J. Schuele, Washougal, WA (US); Sheng Teng Hsu, Camas, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 287 days.

(21) Appl. No.: 11/376,542

(22) Filed: Mar. 15, 2006

(65) Prior Publication Data

US 2007/0218622 A1 Sep. 20, 2007

(51) Int. Cl.
*H01L 21/8234* (2006.01)
(52) U.S. Cl. ............... 438/238; 438/199; 257/E21.661
(58) Field of Classification Search ........ 438/199–234, 438/238, 618–643, 275–279; 257/E21, 661
See application file for complete search history.

(56) References Cited

U.S. PATENT DOCUMENTS 6,777,286 B2 * 8/2004 Clevenger et al. .......... 438/238

OTHER PUBLICATIONS

Liu et al., *High quality single-crystal Germanium on insulator by liquid-phase epitaxy on Silicon substrate*, Applied Physics Letters, vol. 84, No. 14, pp. 2563-2565.

* cited by examiner

Primary Examiner—H. Jey Tsai

(57) ABSTRACT

A method of fabricating local interconnect on a silicon-germanium 3D CMOS includes fabricating an active silicon CMOS device on a silicon substrate. An insulator layer is deposited on the silicon substrate and a seed window is opened through the insulator layer to the silicon substrate and to a silicon CMOS device gate. A germanium thin film is deposited on the insulator layer and into windows, forming a contact between the germanium thin film and the silicon device. The germanium thin film is encapsulated in a dielectric material. The wafer is heated at a temperature sufficient to flow the germanium, while maintaining the other layers in a solid condition. The wafer is cooled to solidify the germanium as single crystal germanium and as polycrystalline germanium, which provides local interconnects. Germanium CMOS devices may be fabricated on the single crystal germanium thin film.

14 Claims, 4 Drawing Sheets

METHOD OF FABRICATING LOCAL INTERCONNECTS ON A SILICON-GERMANIUM 3D CMOS

FIELD OF THE INVENTION

This invention relates to high speed integrated circuits, and specifically to a method for fabrication of a germanium CMOS device on a silicon CMOS device and other 3D CMOS devices.

BACKGROUND OF THE INVENTION

Known silicon-germanium CMOS structures are fabricated above, or on, a conventional silicon CMOS, and a dielectric layer is provided to separate the convention silicon CMOS from the germanium CMOS. The interconnection between the silicon CMOS and germanium CMOS is difficult to fabricate. This invention provides a local interconnect between the silicon CMOS and germanium CMOS that can significantly increase the device density.

Liu et al., *High quality single-crystal Germanium on insulator by liquid-phase epitaxy on Silicon substrate*, Applied Physics Letters, vol. 84, no. 14, pp 2563-2565.

SUMMARY OF THE INVENTION

A method of fabricating local interconnect on a silicon-germanium 3D CMOS includes fabricating an active silicon CMOS device on a silicon substrate; depositing an insulator layer on the silicon substrate; opening a seed window through the insulator layer to the silicon substrate and to the device gate; depositing a germanium thin film on the insulator layer, wherein the germanium fills the windows forming a contact between the germanium thin film and the silicon substrate, and between the germanium thin film and the silicon CMOS device; patterning and etching the germanium thin film; encapsulating the germanium thin film in a dielectric material; rapid thermal annealing the wafer and the layers formed thereon at a temperature sufficient to flow the germanium, while maintaining the other layers in a solid condition; cooling to solidify the germanium as single crystal germanium and as polycrystalline germanium; fabricating a germanium CMOS on the single crystal germanium thin film; and using germanium taken from the forms of germanium consisting of single crystal germanium and polycrystalline germanium to form local interconnects between the silicon CMOS and the germanium CMOS.

A method of fabricating local interconnect on a silicon-germanium 3D CMOS SRAM cell includes fabricating a silicon NMOS pull down transistor and a silicon NMOS pass gate transistor; fabricating a germanium PMOS pull up transistor; and forming a germanium local interconnect to connect the germanium PMOS pull-up transistor, the silicon NMOS pull-down transistor and the silicon NMOS pass gate transistor.

It is an object of the method of the invention to provide an easily fabricated interconnect between a silicon CMOS and a germanium CMOS.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Interconnects for silicon/silicon 3D devices are usually formed by fabricating metal wires which extend through wafer via holes formed in a wafer in stacked devices which are formed on a plural wafers. The method of the invention uses liquid phase epitaxial germanium growth, which provides, in a seeding area where germanium is in direct contact with silicon, a local interconnect between a silicon CMOS and a germanium CMOS.

Figure 1:
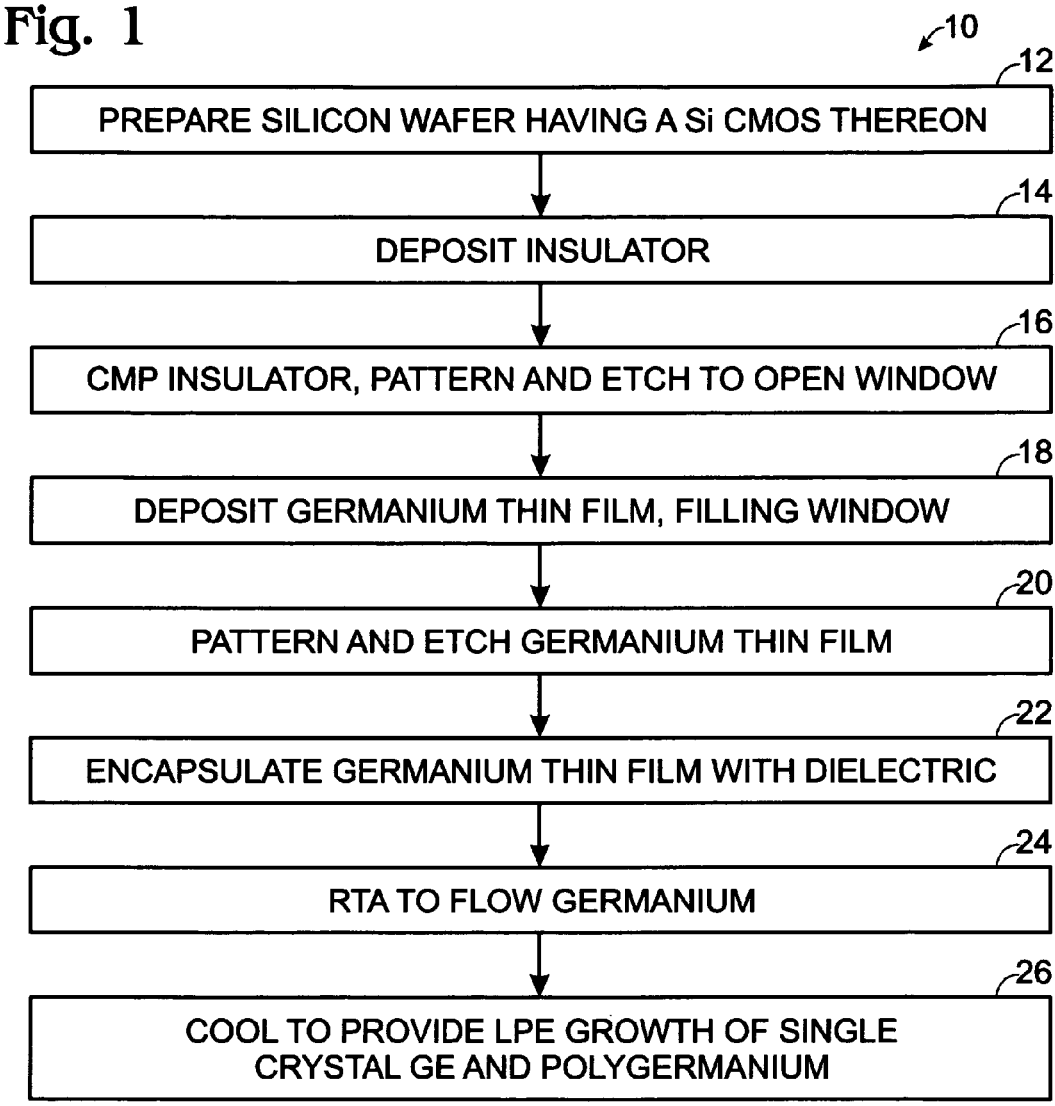
FIG. 1 is a block diagram of the method of the invention.

Referring to FIG. 1, a generalized method of the invention is depicted generally at 10. Depending on the nature of the device being fabricated, not all of the steps of the generalized method of the invention are required. A silicon wafer, including any number of silicon-based CMOS devices, is prepared, step 12. A thin layer of insulating material, such as silicon oxide or silicon nitride, having a thickness of between about 500 nm and 1000 nm, is deposited, step 14, onto the silicon wafer. The insulator layer may be a single insulator layer, or may be a combination of insulator layers. A CMP process, step 16, is used to smooth the insulator layer before the layer is patterned. Patterning and etching forms a seed window, wherein the seed window is open to the gate of any CMOS devices and to the silicon substrate, or to an active layer in a single-crystal silicon. A germanium thin film is then non-selectively deposited, step 18, to a thickness of between about 5 nm to 500 nm, filling the seed windows. The germanium thin film may be polycrystalline germanium or amorphous germanium. The germanium deposition method may be chemical vapor deposition (CVD), physical vapor deposition (PVD), molecule beam epitaxy (MBE), or any other suitable thin film deposition methods. Next, the germanium film is patterned and etched, step 20, into desired features. These features must include a small area where the germanium is in direct contact with the silicon substrate, or with the gate of any CMOS device, without any intervening layers or material therebetween. This area provides a seed for a subsequent germanium epitaxial process. A conformal layer of silicon oxide dielectric, or other dielectrics such as silicon nitride, having a thickness of between about 10 nm to 500 nm, is deposited to encapsulate the germanium film, step 22.

Rapid thermal annealing (RTA) 24 is used to heat the germanium film to a target temperature of between about 920° C. to 1000° C. After the wafer reaches the target temperature, the wafer is annealed for between about zero seconds to sixty seconds. A very short annealing time occurs when the wafer reaches the target temperature and is immediately cooled. The melting temperature for crystalline germanium is 938° C. During this heat treatment the germanium thin film melts, and the SiN and SiO₂ films act as micro-crucibles, preventing the liquid germanium from flowing. The silicon substrate, SiO₂ and SiN layers remain solid at the prescribed temperatures. The wafer is then cooled. During the cooling process, liquid phase epitaxial (LPE) growth, step 26, of germanium occurs, with the growth front starting at the silicon/germanium interface in the seed windows, propagating laterally through the germanium thin film, forming a single crystalline germanium layer, wherein any defects are concentrated and terminated at the seeding window. The preceding process is referred to as germanium-on-insulator (GOI) formation. This process provides the base material for a germanium CMOS-on-insulator thin film device fabrication. If a seed window is open to the polysilicon, i.e., the gate material for a silicon CMOS device, the re-crystallized germanium film is polycrystalline in nature. A polycrystalline germanium film may be used as the local interconnect material in this application. An important feature of this invention is control of the seed window where the germanium thin film is in direct contact with the single-crystal silicon substrate and the polysilicon gate. This window may be used to form a local interconnect between a top germanium CMOS and a bottom silicon CMOS.

Figure 2:
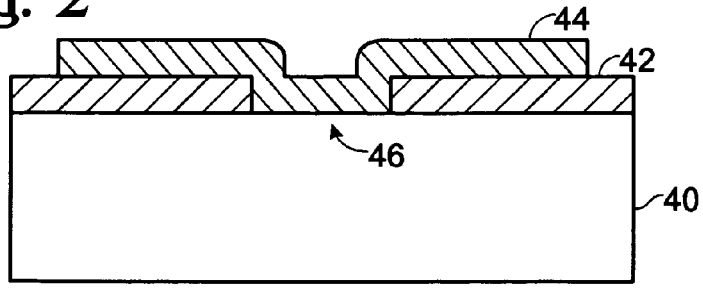
FIG. 2 depicts the basic structure of germanium liquid phase epitaxy, used in the method of the invention.

FIG. 2 depicts a result of germanium LPE according to the method of the invention. A silicon substrate 40, which has a silicon CMOS fabricated thereon, has an insulating layer 42, such as silicon nitride, silicon oxide, or a combination of layers thereof, formed thereon, and a germanium layer 44 formed on the insulating layer. 3D silicon-germanium CMOS circuitry may be fabricated on this form of wafer. A seed window 46 between the silicon substrate, silicon CMOS circuitry and germanium CMOS circuitry is provided to form a local interconnect (LI) for the 3D germanium-silicon CMOS circuitry. The local interconnect between the 3D silicon-germanium is especially useful for static random access memory (SRAM) applications. A SRAM cell, built by the silicon-germanium CMOS method of the invention is used as an example in the following description to demonstrate the usefulness of the local interconnect.

Figure 3:
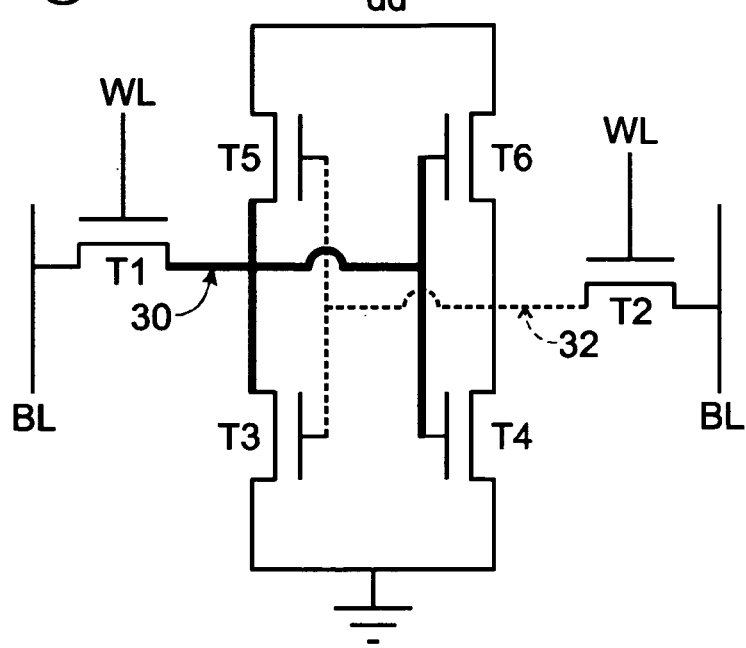
FIG. 3 is a schematic representation of a six-transistor SRAM cell.

FIG. 3 is a schematic of a six-transistor SRAM cell, including two NMOS transistors (T3 and T4) and two PMOS transistors (T5 and T6), which are used to construct a simple latch to store the data, and two pass gate NMOS transistors (T1 and T2), which connected the cell to the bit lines (BL). In this embodiment of a Si—Ge 3D-SRAM constructed according to the method of the invention, T1 and T2 are silicon NMOS pass-gate transistors, T3 and T4 are the silicon NMOS pull-down transistors, and T5 and T6 are germanium NMOS pull-up transistors. To achieve a high density of Si—Ge 3D SRAM cells, local interconnection is necessary to make the requisite electrical connections between the source/drain of T1, T3, T5, the gates of T4 and T6, shown at 30, and between the source/drain of T2, T4, T6, and the gates of T3 and T5, shown at 32.

Figure 4:
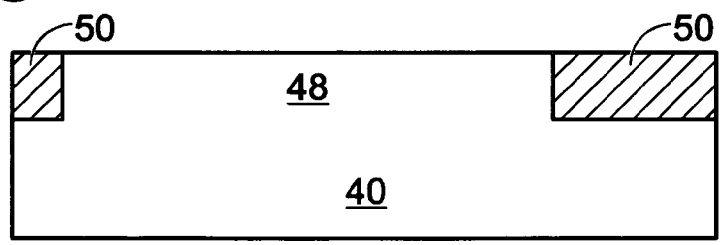
FIG. 4-10 depict various stages in the fabrication of a Si—Ge 3D SRAM cell according to the method of the invention.

Referring FIG. 4, an active layer 48 is defined in silicon substrate 40 by a shallow trench isolation structure 50, filled with silicon oxide. In the case of a SRAM cell, a silicon pass-gate transistor and a pull down transistor are fabricated in the silicon substrate, wherein, in the preferred embodiment, both transistors are NMOS type transistors.

Figure 5:
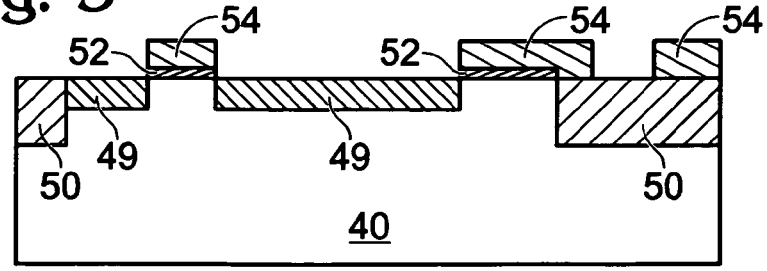

As shown in FIG. 5 following state-of-the-art silicon CMOS fabrication processes, silicon CMOS transistors are completed, including fabrication of a gate dielectric 52, a gate 54, and formation of source/drain region 49 of the transistor. At this stage of fabrication according to the method of the invention, only NMOS transistors are shown. CMOS (NMOS and PMOS) are fabricated on the peripheral control circuit surrounding the SRAM memory array.

Figure 6:
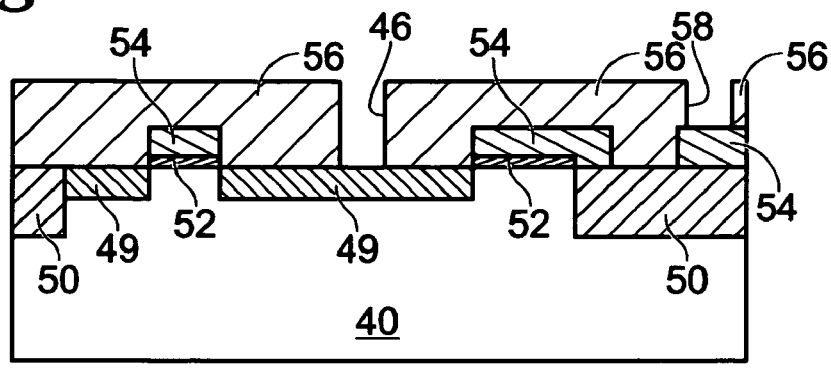
Figure 11:
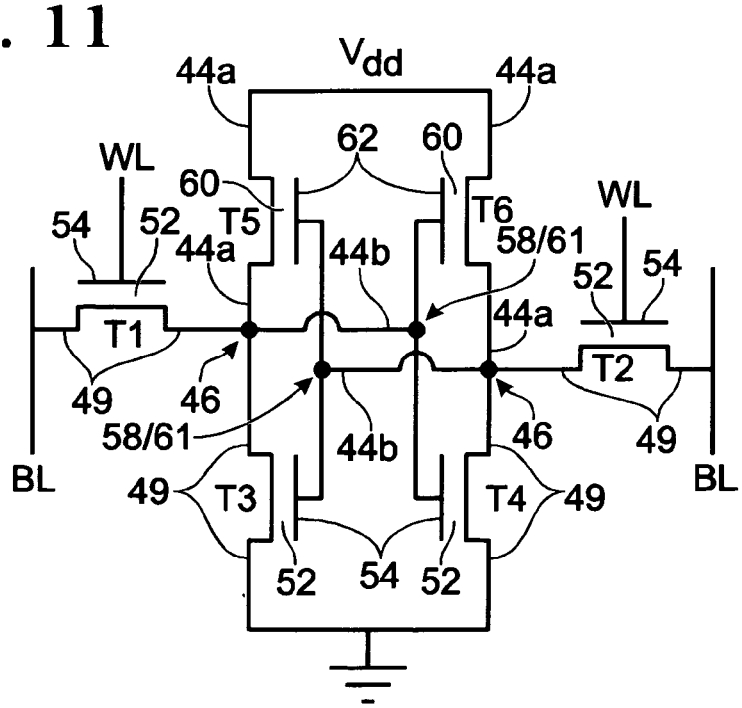
FIG. 11 is a schematic representation of the completed six-transistor Si—Ge 3D SRAM cell structure.

FIG. 6 depicts an interlayer dielectric (ILD) 56 deposition 14, which is followed by CMP 16 to planarize the wafer surface, and to open seed windows 46, 58 for the subsequent germanium epitaxial process. Seed windows 46 are opened to single-crystal silicon, 49, while seed windows 58 are opened to transistor gate 54, which may be polysilicon, polySiGe or metal. ILD layer 56 may be $SiO_2$, SiN, the combination of $SiO_2$ and SiN, or any combination of dielectric layers. Location of the seed windows in the SRAM cell are shown in FIG. 11.

Figure 7:
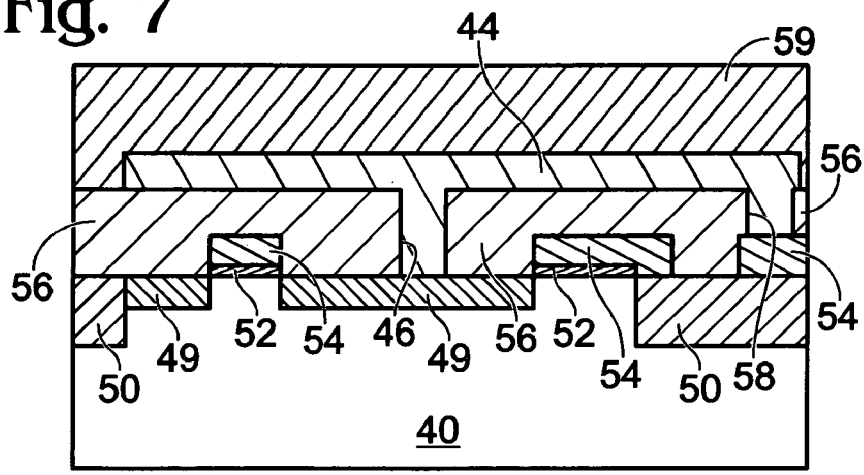

FIG. 7 depicts germanium 44 deposition, step 18, patterning, step 20, and encapsulation, step 22 with dielectric layer 59. There are four seed windows provided for the germanium epitaxial growth in the depicted SRAM memory cell, as shown in FIG. 11. Two windows, 46, are open to single-crystal silicon 49, and two other windows, 58, are open to gate 54. Dielectric layer 59 may be $SiO_2$, SiN, or other suitable dielectrics, having a thickness of between about 10 nm to 500 nm.

Figure 8:
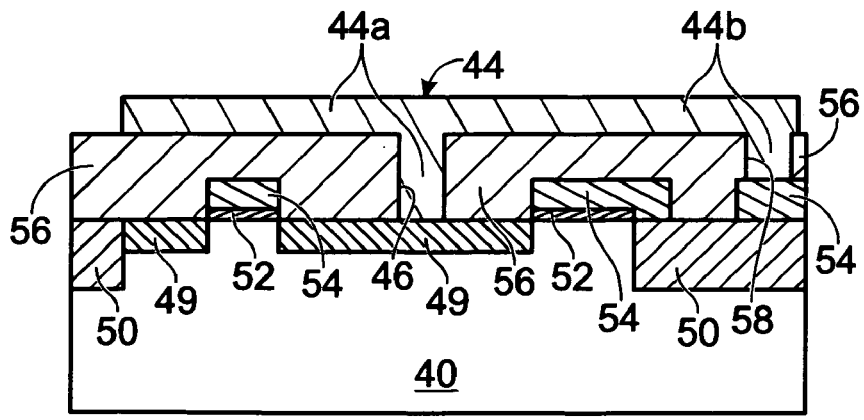

FIG. 8 depicts the wafers after RTA process 24 and removal of the encapsulating dielectric layer 22. During the course of the germanium LPE process 24, a single crystal of germanium 44a will grow on the germanium film which is in contact with the single-crystal silicon, while polygermanium 44b may be formed on the germanium film which is in contact with gate 54. The gate material for silicon devices may be polysilicon, polySiGe, or another metal. Polygermanium film, formed by LPE, is used for local interconnect applications. Proper doping, e.g., n-type dopants such as phosphorous or arsenic, of the germanium film for the local interconnect application is necessary to reduce the resistance of the interconnects.

Figure 9:
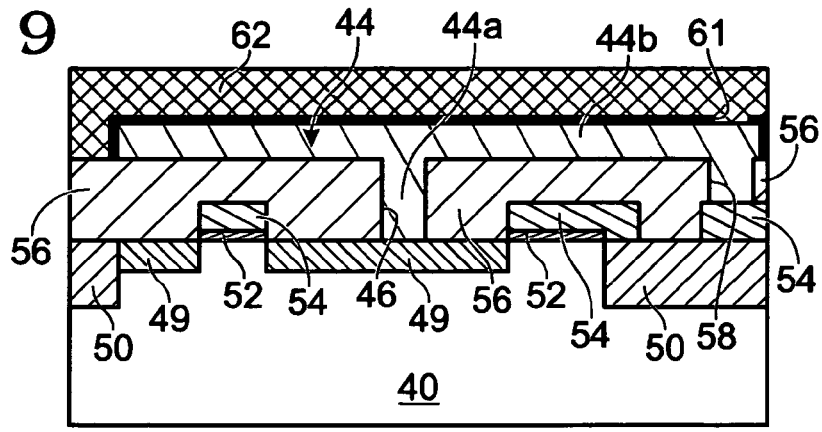

FIG. 9 shows the structure following deposition of an insulator layer 60 for use as the germanium gate dielectric, etching to open a window 61 in the germanium gate dielectric, which window is aligned with window 58, and deposition of a germanium gate material. Window 61 is opened in the gate dielectric for the electrical connection between the pull-up transistor gate 62, i.e., a germanium PMOS, and the pull-down transistor gate 54, i.e., a silicon NMOS.

Figure 10:
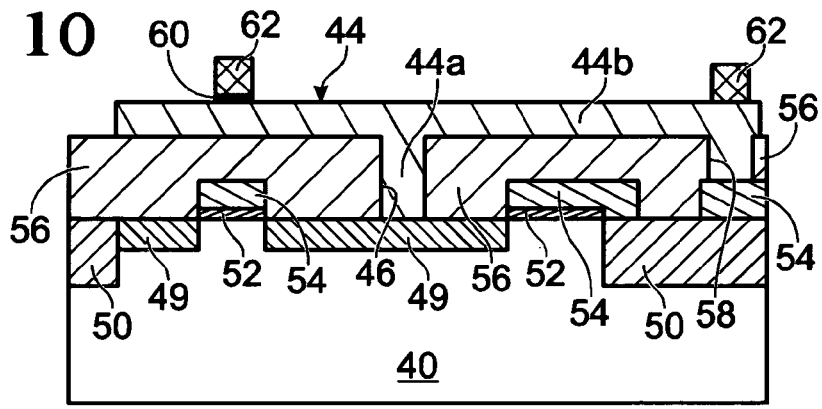

FIG. 10 depicts the nearly complete Si—Ge 3D SRAM cell following deposition and definition of gate 62 for a germanium transistor. The local interconnect used in this SRAM cell example connects (1) a germanium PMOS gate, (2) a silicon NMOS gate, (3) a germanium PMOS source/drain, and (4) a silicon NMOS source/drain. As is common in MOS transistor structure, the gate and source/drain for an NMOS is n-type doped, whereas the gate and source/drain for a PMOS is p-type doped. The local interconnect in this SRAM cell example would have a contact problem if the gate/source/drain for NMOS is n-type doped and the gate/source/drain for PMOS is p-type doped. To prevent the contact problem and to provide lower resistance on the local interconnect, the local interconnect is n-type doped. In this case, a PN junction formation occurs at the interface connection between the germanium local interconnect, which is n-type doped, and the germanium PMOS source/drain, which is p-type doped. To prevent formation of a PN junction, a layer of $GeM_x$, where M is metal, such as Ti, Co, Ni, Ta, and where x is between 0.3 to 3, is provided on the germanium local interconnect and on the germanium PMOS source/drain areas. The $GeM_x$ formation is similar to a self-aligned silicide process, commonly used in silicon VLSI technology.

For the germanium PMOS gate, the gate material for the germanium transistor may be polysilicon, polygermanium, polySiGe, or a metal, such as TiN, TaN, W, NiSi. When the germanium PMOS gate material is metal, there is no contact problem between the silicon NMOS gate/source/drain, the n-type germanium interconnect, and the germanium PMOS metal gate. When the germanium PMOS gate material is polysilicon, polySiGe or polygermanium, a buried channel germanium PMOS may have to be used in the SRAM cell. In a buried channel germanium PMOS case, the gate for the germanium PMOS is n-type doped. Therefore, low contact resistance is guaranteed between the n-type germanium local interconnect, the n-type germanium PMOS gate, and the silicon NMOS gate/source/drain.

The structure according to the method of the invention is completed following deposition of dielectric and metallization using the state-of-art back-end-of-line silicon IC process technology to complete the wafer fabrication.

FIG. 11 is a schematic representation of the silicon-germanium CMOS SRAM cell of the method of the invention. Following state-of-the-art IC processes, word lines (WL), bit lines, $V_{dd}$ and ground for the SRAM cell, and peripheral circuitries, are constructed.

As shown in the drawings and as described in this Specification, the description includes all steps of the best mode of practicing the invention. There are no additional steps, and the various layers, as described, are formed and/or deposited in sequence without any intervening steps or layers when practicing the method of the invention.

Thus, a method of fabricating local interconnects on a silicon-germanium 3D CMOS through provision of seeding windows in a silicon CMOS device to facilitate formation of a single-crystal germanium layer and a polycrystalline germanium layer has been disclosed. It will be appreciated that further variations and modifications thereof may be made within the scope of the invention as defined in the appended claims.

We claim:

1. A method of fabricating local interconnect on a silicon-germanium 3D CMOS comprising:
    fabricating an active silicon CMOS device, having a gate, on a silicon substrate;
    depositing an insulator layer on the silicon substrate;
    opening a seed window through the insulator layer to the silicon substrate and to the gate of the silicon CMOS device;
    depositing a germanium thin film on the insulator layer, wherein the germanium fills the windows forming a contact between the germanium thin film and the silicon substrate, and between the germanium thin film and the silicon CMOS device;
    patterning and etching the germanium thin film;
    encapsulating the germanium thin film in a dielectric material;
    rapid thermal annealing the wafer and the layers formed thereon at a temperature sufficient to flow the germanium, while maintaining the other layers in a solid condition;
    cooling to solidify the germanium as single crystal germanium and as polycrystalline germanium;
    fabricating a germanium CMOS on the single crystal germanium thin film; and
    using germanium taken from the forms of germanium consisting of single crystal germanium and polycrystalline germanium to from local interconnects between the silicon CMOS and the germanium CMOS.

2. The method of claim 1 wherein said rapid thermal annealing includes rapidly heating at a target temperature of between about 920° C. to 1000° C., and annealing at the target temperature for between about zero seconds and sixty seconds.

3. The method of claim 1 wherein said depositing a germanium thin film on the insulator layer includes depositing a germanium layer taken from the group of germanium materials consisting of polygermanium and amorphous germanium.

4. The method of claim 1 wherein the seed window provides for a germanium-to-silicon interface so that a germanium crystallization process begins at the germanium-to-silicon interface and provides electrical contact between germanium-based devices and silicon-based devices.

5. A method of fabricating local interconnect on a silicon-germanium 3D CMOS SRAM cell comprising:
    fabricating a silicon gate transistor;
    fabricating a silicon NMOS pull down transistor and a silicon NMOS pass gate transistor;
    fabricating a germanium-on-insulator thin film by liquid phase epitaxy;
    fabricating a germanium PMOS pull up transistor; and
    forming a germanium local interconnect to connect the germanium PMOS pull-up transistor, the silicon NMOS pull-down transistor and the silicon NMOS pass gate transistor.

6. The method of claim 5 wherein said fabricating a germanium-on-insulator thin film and said forming a germanium local interconnect include rapid thermal annealing at a temperature sufficient to flow the germanium, while maintaining other materials in a solid condition.

7. The method of claim 6 wherein said rapid thermal annealing includes rapidly heating to a target temperature of between about 920° C. to 1000° C., and annealing at the target temperature for between about zero seconds and sixty seconds.

8. The method of claim 5 which includes doping the germanium local interconnect with an n-type dopant taken from the group of n-type dopants consisting of phosphorus or arsenic to reduce the resistance in the germanium local interconnect.

9. The method of claim 5 which includes formation of $GeM_x$ to prevent PN diode formation at the germanium film, wherein M is a metal taken from the group of metals consisting of Ti, Co, Ni and Ta, and where x has a value of between 0.3 to 3.

10. The method of claim 5 wherein the germanium PMOS includes a gate formed of a material taken from the group of materials consisting of n-type polysilicon, n-type polygermanium and n-type polySiGe, and forms a buried channel PMOS transistor, thereby preventing formation of a PN junction at the local interconnect between the germanium PMOS gate, a silicon NMOS gate and a silicon NMOS source/drain.

11. A method of fabricating local interconnect on a silicon-germanium 3D CMOS comprising:
    preparing a silicon substrate wafer;
    depositing a gate dielectric layer and forming a gate thereon;
    fabricating an active silicon CMOS device, having a device gate, on the silicon substrate;
    depositing an insulator layer on the silicon substrate;
    opening a window through the insulator layer to the silicon substrate and to the device gate;
    depositing a germanium thin film on the insulator layer, wherein the germanium fills the windows forming a contact between the germanium thin film and the silicon substrate, and between the germanium thin film and the silicon CMOS device;
    patterning and etching the germanium thin film;
    encapsulating the germanium thin film with a dielectric material;

annealing the wafer and the layers formed thereon at a temperature sufficient to flow the germanium, while maintaining the other layers in a solid condition; and cooling the wafer and the layers formed thereon to provide for liquid phase epitaxy of the germanium to form a single crystal germanium layer and a polycrystalline germanium layer, wherein the single crystal germanium layer is used for subsequent germanium CMOS fabrication and wherein the polycrystalline germanium layer and single crystal germanium layer are used for local interconnects.

12. The method of claim 11 wherein said annealing the wafer includes rapidly heating the wafer to a target temperature of between about 920° C. to 1000° C., and annealing the wafer at the target temperature for between about zero seconds and sixty seconds.

13. The method of claim 11 wherein said depositing a germanium thin film on the insulator layer includes depositing a germanium layer taken from the group of germanium materials consisting of polygermanium and amorphous germanium.

14. The method of claim 11 wherein the window provides for a germanium-to-silicon interface so that a germanium crystallization process begins at the germanium-to-silicon interface and provides electrical contact between germanium-based devices and silicon-based devices.

* * * * *